(12) United States Patent
Ohkubo

(10) Patent No.: US 8,460,973 B2
(45) Date of Patent: Jun. 11, 2013

(54) SEMICONDUCTOR LIGHT EMITTING APPARATUS, METHOD FOR MANUFACTURING THE SAME, AND LIQUID CRYSTAL DISPLAY APPARATUS USING THE SAME

(75) Inventor: Tsutomu Ohkubo, Tokyo (JP)

(73) Assignee: Stanley Electric Co., Ltd., Tokyo (JP)

( * ) Notice: Subject to any disclaimer, the term of this patent is extended or adjusted under 35 U.S.C. 154(b) by 155 days.

(21) Appl. No.: 12/889,830

(22) Filed: Sep. 24, 2010

(65) Prior Publication Data

US 2011/0069256 A1    Mar. 24, 2011

(30) Foreign Application Priority Data

Sep. 24, 2009 (JP) ................................ 2009-219476

(51) Int. Cl.
*H01L 21/00* (2006.01)

(52) U.S. Cl.
USPC ............... 438/113; 438/26; 438/110; 349/67; 349/69; 257/98; 313/498; 313/512; 445/23; 445/25; 445/58

(58) Field of Classification Search
USPC ........... 438/26, 110, 113; 349/67, 69; 257/98; 313/498, 512; 445/23, 25, 58
See application file for complete search history.

(56) References Cited

U.S. PATENT DOCUMENTS

| | | | |
|---|---|---|---|
| 6,285,420 B1 * | 9/2001 | Mizumo et al. | 349/65 |
| 6,627,922 B1 * | 9/2003 | Ishinaga | 257/99 |
| 6,919,586 B2 * | 7/2005 | Fujii | 257/100 |
| 7,271,423 B2 * | 9/2007 | Hanamoto et al. | 257/98 |
| 7,287,892 B1 * | 10/2007 | Pang et al. | 362/604 |
| 7,491,977 B2 * | 2/2009 | Fukasawa | 257/98 |
| 7,731,405 B2 * | 6/2010 | Ishizaka et al. | 362/555 |
| 7,800,711 B2 * | 9/2010 | Kim | 349/65 |
| 7,960,747 B2 * | 6/2011 | Sakamoto et al. | 257/98 |
| 8,049,237 B2 * | 11/2011 | Yamada et al. | 257/98 |
| 2002/0063301 A1 * | 5/2002 | Hanamoto et al. | 257/432 |
| 2002/0123163 A1 * | 9/2002 | Fujii | 438/26 |
| 2005/0167682 A1 * | 8/2005 | Fukasawa | 257/79 |
| 2005/0248008 A1 * | 11/2005 | Wilson | 257/678 |
| 2006/0002141 A1 * | 1/2006 | Ouderkirk et al. | 362/609 |
| 2006/0239034 A1 * | 10/2006 | Keh et al. | 362/613 |
| 2006/0290844 A1 * | 12/2006 | Epstein et al. | 349/113 |

(Continued)

FOREIGN PATENT DOCUMENTS

| JP | 2007-59612 A | 3/2007 |
|---|---|---|
| JP | 2009-105173 A | 5/2009 |

*Primary Examiner* — Nimeshkumar Patel
*Assistant Examiner* — Thomas A Hollweg
(74) *Attorney, Agent, or Firm* — Holtz, Holtz, Goodman & Chick, P.C.

(57) ABSTRACT

A method for manufacturing a semiconductor light emitting apparatus of side emission type includes disposing a light emitting device on a substrate having a predetermined electrode pattern. A side member is disposed on the substrate to be spaced apart from the light emitting device with a predetermined space. The light emitting device and the electrode pattern are electrically connected. A light reflecting member is disposed in the space between the side member and at least one side surface of the light emitting device so that the light reflecting member is in contact with the at least one side surface of the light emitting device. A light-transmitting sealing member is disposed to surround the light emitting device other than the at least one side surface that is in contact with the light reflecting member. A light-reflective ceiling member is disposed at least over the sealing member.

16 Claims, 11 Drawing Sheets

U.S. PATENT DOCUMENTS

| | | | |
|---|---|---|---|
| 2007/0170454 A1* | 7/2007 | Andrews | 257/100 |
| 2007/0274096 A1* | 11/2007 | Chew et al. | 362/609 |
| 2008/0106912 A1* | 5/2008 | Yeom | 362/613 |
| 2008/0291691 A1* | 11/2008 | Ishizaka et al. | 362/555 |
| 2009/0103005 A1 | 4/2009 | Nakazato et al. | |
| 2009/0166657 A1* | 7/2009 | Yamada et al. | 257/98 |
| 2009/0251634 A1* | 10/2009 | Lu et al. | 349/58 |
| 2009/0262520 A1* | 10/2009 | Park et al. | 362/97.1 |
| 2010/0140648 A1* | 6/2010 | Harada et al. | 257/98 |
| 2010/0320479 A1* | 12/2010 | Minato et al. | 257/88 |
| 2011/0001148 A1* | 1/2011 | Sun et al. | 257/88 |

\* cited by examiner

Fig. 2A
Conventional Art
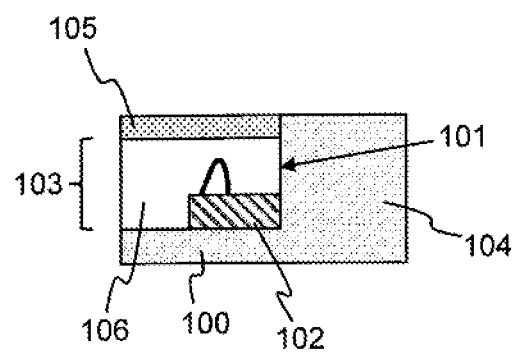
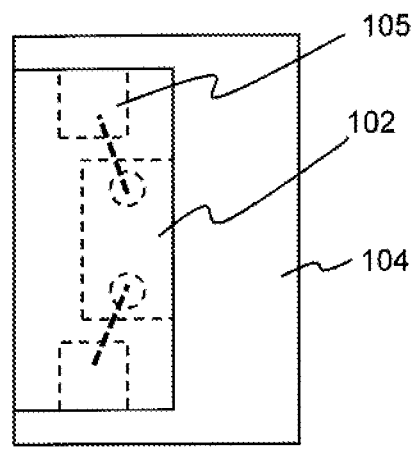
Fig. 2B
Conventional Art

Fig. 4
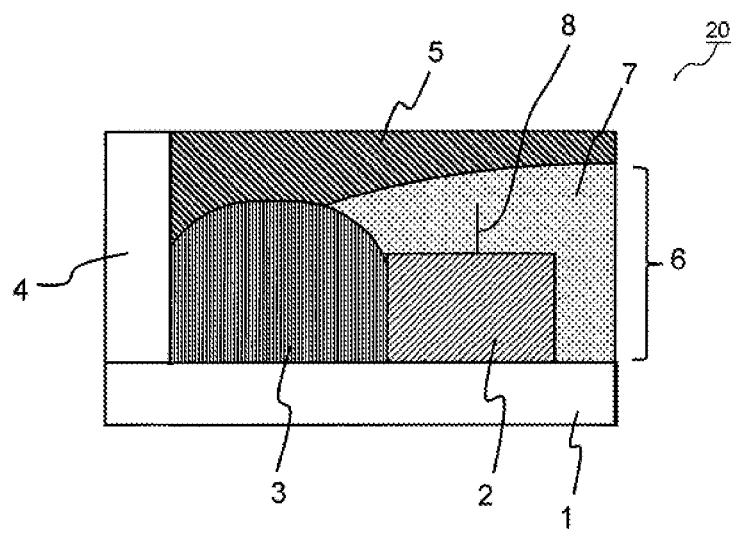
Fig. 5A  Fig. 5B  Fig. 5C
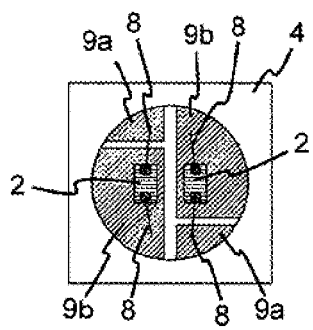 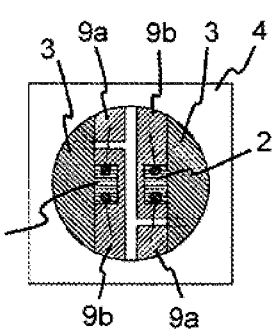 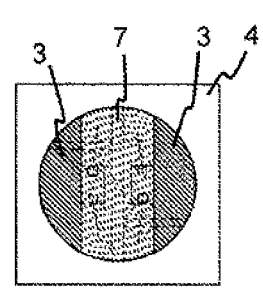
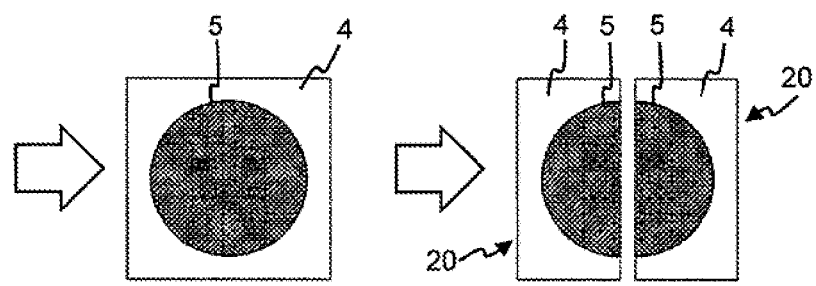
Fig. 5D  Fig. 5E Fig. 6A
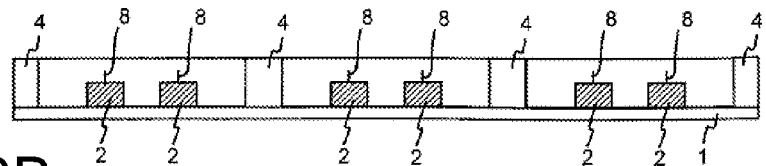
Fig. 6B
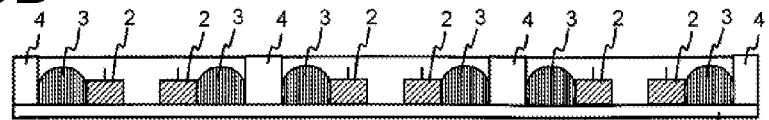
Fig. 6C
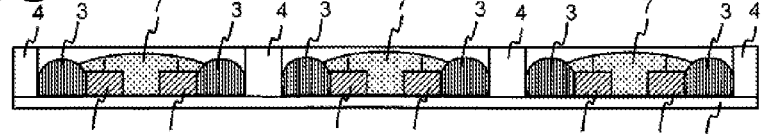
Fig. 6D
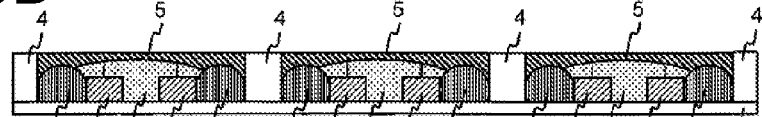
Fig. 6E
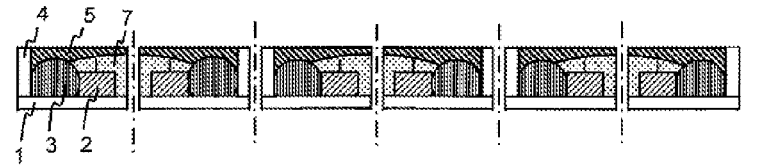
Fig. 7A  Fig. 7B  Fig. 7C  Fig. 7D
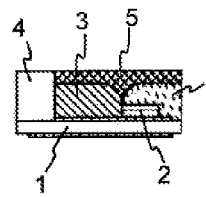 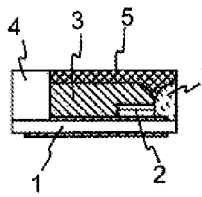 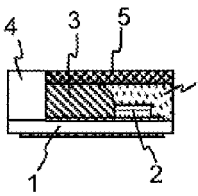 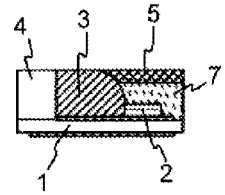
(a)   (b)   (c)   (d)

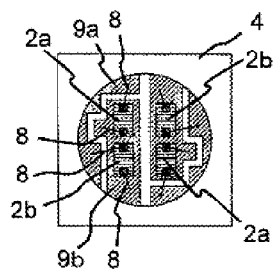 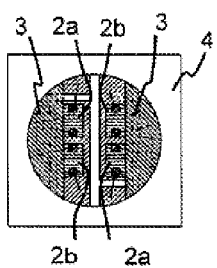 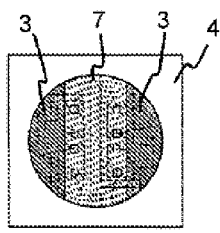
Fig. 10A   Fig. 10B   Fig. 10C
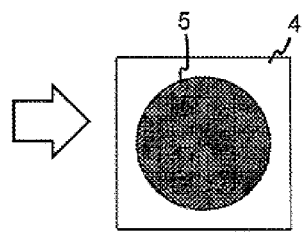 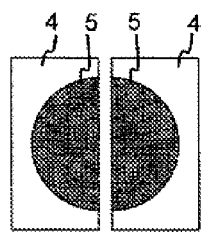
Fig. 10D   Fig. 10E
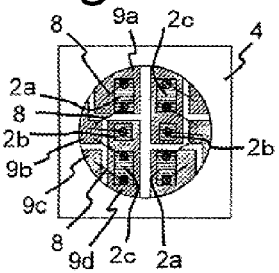 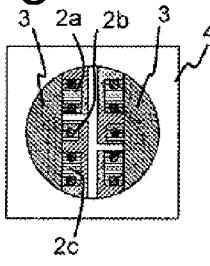 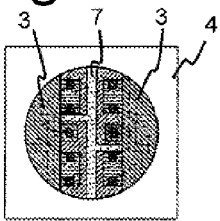
Fig. 11A   Fig. 11B   Fig. 11C
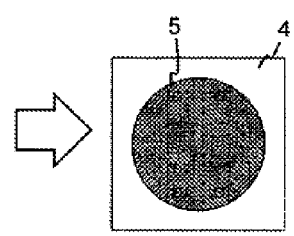 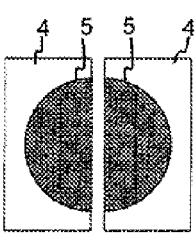
Fig. 11D   Fig. 11E

SEMICONDUCTOR LIGHT EMITTING APPARATUS, METHOD FOR MANUFACTURING THE SAME, AND LIQUID CRYSTAL DISPLAY APPARATUS USING THE SAME

This application claims the priority benefit under 35 U.S.C. §119 of Japanese Patent Application No. 2009-219476 filed on Sep. 24, 2009, which is hereby incorporated in its entirety by reference.

TECHNICAL FIELD

The present invention relates to a semiconductor light emitting apparatus having a light emitting device (LED) installed therein, and in particular, to a semiconductor light emitting apparatus suitable for an edge-lighting type backlight for a liquid crystal display apparatus.

BACKGROUND ART

Conventionally known liquid crystal display apparatuses utilize a backlight, and for example, concrete examples thereof include a direct type backlight in which a light source unit including a light emitting device is disposed in the rear of a liquid crystal panel, and an edge-lighting type backlight in which a light source unit including light emitting devices arranged in line is disposed while facing to the end portion of a light guide plate. The present invention specifically aims to provide a semiconductor light emitting apparatus for use in the latter edge-lighting type backlight.

As the thinning of profiles of the liquid crystal display apparatus progresses, the light guide plate and the light source for an edge-lighting type backlight are also required to be thinned. For example, Japanese Patent Application Laid-Open No. 2009-105173 (US2009/0103005A1 corresponding thereto) discloses a light source module having a structure in which the upper surface of a light source device (LED chip) faces to the end of a light guide plate, thereby making its profile thinned and reducing the used amount of a sealed resin. Japanese Patent Application Laid-Open No. 2007-59612 discloses a light emitting diode of side emission type. The light emitting diode includes substrates provided above and below the components, a light emitting device interposed between the substrates and having a side facing to an end of a light guide plate, a reflector surrounding three sides of the light emitting device other than the side closer to the light guide plate, and a transparent resin with which a space defined by the substrates and the reflector is filled.

Hereinafter, a description will be given of a conventional semiconductor light emitting apparatus utilizing a light emitting diode as described in Japanese Patent Application Laid-Open No. 2007-59612 with reference to FIGS. 1A and 1B. The semiconductor light emitting apparatus of so-called side-view type includes a light emitting device 102, of which a side surface faces to an end of a light guide plate, a substrate 100, a side member 104, and an upper substrate 105. The light emitting device 102 is disposed within a cavity defined by the substrate 100, the side member 104, and the upper substrate 105 and having a light projecting outlet 103 at its one side. It should be noted that the inner surface of the cavity can also serve as a reflecting surface, and the deepest side is called as a reflector 101 hereinafter. The cavity is filled with a transparent sealing material 106.

In the above-configured light emitting apparatus, when the light emitting device 102 is activated, light can be emitted from its entire peripheral surfaces. In this case, the light emitting device 102 can emit light toward the reflector 101 of the side member 104 (in the rearward direction) which is opposite from the light projecting outlet 103. The light can be reflected by the reflector 101 to be directed to the light projecting outlet 103. This means the light must travel a longer optical path from the light emitting device 102 via the reflector 101 to the light projecting outlet 103. The sealing material 106 existing in the optical path can attenuate the light more.

In order to cope with this problem, a semiconductor light emitting apparatus as shown in FIGS. 2A and 2B has been devised. The semiconductor light emitting apparatus includes a light emitting device 102 that is in contact with a reflector 101 at the rear surface of the light emitting device 102. However, when manufacturing such a semiconductor light emitting apparatus as shown in FIGS. 2A and 2B, there are the following problems.

FIG. 3A shows a typical manufacturing step of such a semiconductor light emitting apparatus as shown in FIGS. 1A and 1B. In this case, when the light emitting device 102 is disposed within a cavity, the light emitting device 102 is sucked by a suction jig 107 at the tip end of the jig 107 to be moved for positioning. In order to manufacture the semiconductor light emitting apparatus as shown in FIGS. 2A and 2B, the light emitting device 102 must be precisely disposed so that it is brought into contact with a side member 104. However, the control of the jig 107 is not so easy.

For example, as shown in FIG. 3B, if the outer diameter of the suction jig 107 is larger than that of the light emitting device 102, when the suction jig 107 is lowered while sucking the light emitting device 102, the suction jig 107 collides with the side member 104. Accordingly, the light emitting device 102 cannot be disposed while being in contact with the side member 104.

In order to cope with this problem, it is conceivable that the diameter of the suction jig 107 can be reduced as shown in FIG. 3C. However, also in this case, when the movement accuracy of the suction jig 107 is low in the direction toward the main surface of the substrate 100, the light emitting device 102 may collide with the upper surface of the side member 104. Accordingly, it is difficult to dispose the light emitting device 102 while being brought into contact with the side face of the side member 104 with high accuracy.

SUMMARY

The present invention was devised in view of these and other problems and features in association with the conventional art, and provides a semiconductor light emitting apparatus of side emitting type with high light emission efficiency and light utilization efficiency as well as a manufacturing method.

A first aspect of the present invention provides a method for manufacturing a semiconductor light emitting apparatus. The method can include: disposing a light emitting device on a substrate having a predetermined electrode pattern formed thereon; disposing a side member on the substrate to be spaced apart from the light emitting device with a predetermined space; electrically connecting the light emitting device with the electrode pattern; disposing a light reflecting member in a space between at least one side surface of the light emitting device and the side member so that the light reflecting member is in contact with the at least one side surface of the light emitting device; disposing a sealing member to surround the light emitting device other than the side surface thereof that is in contact with the light reflecting member, the sealing member being adapted to transmit light from the light emitting device; and disposing a ceiling member at least on or above the sealing member, the ceiling member being light reflective.

In the above configuration, the semiconductor light emitting apparatus can include a light projecting outlet. Assuming that the side surface of the light emitting device closest to the light projecting outlet is a front surface and that the side surface of the light emitting device opposite from the front surface is a rear surface, the side member can surround both the side surfaces and rear surface of the light emitting device other than the front surface while being spaced apart therefrom. In addition, in the step of disposing the light reflecting member, the light reflecting member can be disposed in a space between the side member on a rear surface side of the light emitting device and the rear surface of the light emitting device, and the light reflecting member can be brought into contact with the rear surface of the light emitting device.

In the step of disposing the light reflecting member, an uncured resin material for forming the light reflecting member can be disposed. In the step of disposing the sealing member, an uncured resin material for forming the sealing member can be disposed. The resin materials for forming the light reflecting member and for forming the sealing member can then be simultaneously cured.

The electrode pattern on the substrate can be present behind the light emitting device, and in the step of electrically connecting the device to the pattern, the light emitting device and the electrode pattern present behind the device can be connected with each other via a wire, which is buried in the light reflecting member disposed in the space between the side member on the rear surface side of the light emitting device and the rear surface of the light emitting device, with an original shape of the wire remaining.

The step of disposing the light reflecting member can include forming the light reflecting member by using a resin material having an adjusted thixotropic property and/or an adjusted viscosity so that the light reflecting member disposed in the space between the side member on the rear surface side of the light emitting device and the rear surface of the light emitting device has a raised shape having a convex surface that is higher than the top surface of the light emitting device.

A second aspect of the present invention provides a method for manufacturing a semiconductor light emitting apparatus. The method can include: disposing a light emitting device on a substrate having a predetermined electrode pattern formed thereon; electrically connecting the light emitting device with the electrode pattern; disposing a light reflecting member in a space on the substrate so that the light reflecting member is at least partly in contact with a side surface of the light emitting device; disposing a sealing member to surround the light emitting device other than a part thereof that is in contact with the light reflecting member, the sealing member being adapted to transmit light from the light emitting device; and disposing a ceiling member at least on or above the sealing member, the ceiling member being light reflective.

In the above configuration, the light reflecting member can be provided by being hardened after filling or coating a light reflective resin material.

In the above configuration, the sealing member can be provided by being hardened after filling or coating a sealing resin material.

In the above configuration, the ceiling member can be provided by being hardened after filling or coating a light reflective resin material or by providing a light reflective film.

A third aspect of the present invention provides a semiconductor light emitting apparatus. The semiconductor light emitting apparatus can include: a substrate; a light emitting device disposed on the substrate; a side member surrounding the light emitting device and spaced apart therefrom with a predetermined space, the side member having an opening at one side; a light reflecting member disposed in a space between a side surface of the light emitting device opposite from the opening and the side member so that the light reflecting member is in contact with the side surface of the light emitting device opposite from the opening; a sealing member disposed in a space between the side member and side surfaces of the light emitting device where the light reflecting member is not provided, the sealing member being adapted to transmit light from the light emitting device; and a ceiling member covering at least the sealing member, the ceiling member being light reflective.

The substrate can have an electrode formed thereon. A wire for electrically connecting the electrode on the substrate and the light emitting device can be disposed in the space between the side surface of the light emitting device opposite from the opening and the side member. The light reflecting member can be provided so as to bury the wire.

The semiconductor light emitting apparatus can further include an electronic circuit device disposed in the space between the side surface of the light emitting device opposite from the opening and the side member. The light reflecting member can be provided so as to bury the electronic circuit device.

A fourth aspect of the present invention provides a semiconductor light emitting apparatus. The semiconductor light emitting apparatus can include: a substrate; a light emitting device disposed on the substrate; a light reflecting member disposed in a space surrounding a part of the light emitting device so that the light reflecting member is in contact with at least one side surface of the light emitting device; a sealing member disposed to surround the light emitting device other than an area of the light emitting device that is in contact with the light reflecting member, the sealing member being adapted to transmit light from the light emitting device; and a ceiling member covering at least the sealing member, the ceiling member being light reflective. Furthermore, the light reflecting member can be disposed so as to be in contact with the ceiling member.

A fifth aspect of the present invention provides a liquid crystal display apparatus. The liquid crystal display apparatus can include a liquid crystal panel having a front surface that is observed from outside and a rear surface opposite from the front surface, a light guide plate disposed to face the rear surface of the liquid crystal panel and having an end surface that serves as a light receiving surface, and a semiconductor light emitting apparatus disposed so as to face the end surface of the light guide plate. The semiconductor light emitting apparatus can include: a substrate; a light emitting device disposed on the substrate; a side member surrounding the light emitting device and spaced apart therefrom with a predetermined space, the side member having an opening at one side; a light reflecting member disposed in a space between a side surface of the light emitting device opposite from the opening and the side member so that the light reflecting member is in contact with the side surface of the light emitting device opposite from the opening; a sealing member disposed in a space between the side member and side surfaces of the light emitting device where the light reflecting member is not provided, the sealing member being adapted to transmit light from the light emitting device; and a ceiling member covering at least the sealing member, the ceiling member being light reflective.

A sixth aspect of the present invention provides a liquid crystal display apparatus. The liquid crystal display apparatus can include a liquid crystal panel having a front surface that is observed from outside and a rear surface opposite to the front surface, a light guide plate disposed to face the rear surface of the liquid crystal panel and having an end surface that serves as a light receiving surface, and a semiconductor light emitting apparatus disposed so as to face the end surface of the light guide plate. The semiconductor light emitting apparatus can include: a substrate; a light emitting device disposed on the substrate; a light reflecting member disposed in a space surrounding a part of the light emitting device so that the light reflecting member is in contact with at least one side surface of the light emitting device; a sealing member disposed to surround the light emitting device other than an area of the light emitting device that is in contact with the light reflecting member, the sealing member being adapted to transmit light from the light emitting device; and a ceiling member covering at least the sealing member, the ceiling member being light reflective. Furthermore, the light reflecting member is disposed so as to be in contact with the ceiling member.

BRIEF DESCRIPTION OF DRAWINGS

These and other characteristics, features, and advantages of the present invention will become clear from the following description with reference to the accompanying drawings, wherein:

FIG. 2A is a cross-sectional view illustrating an improved conventional semiconductor light emitting apparatus, and FIG. 2B is a top plan view of the same;

FIG. 4 is a cross-sectional view illustrating a semiconductor light emitting apparatus according to a first exemplary embodiment of the present invention;

FIGS. 5A, 5B, 5C, 5D, and 5E are top plan views illustrating the production processes for manufacturing the semiconductor light emitting apparatus according to the first exemplary embodiment;

FIGS. 6A, 6B, 6C, 6D, and 6E are cross-sectional views illustrating the production processes for manufacturing the semiconductor light emitting apparatus according to the first exemplary embodiment;

FIGS. 7A, 7B, 7C, and 7D are cross-sectional views illustrating a plurality of examples of the inner structure of the semiconductor light emitting apparatus according to the first exemplary embodiment;

FIGS. 10A, 10B, 10C, 10D, and 10E are top plan views illustrating the production processes for manufacturing the semiconductor light emitting apparatus according to a fourth exemplary embodiment, with two light emitting devices installed therein;

FIGS. 11A, 11B, 11C, 11D, and 11E are top plan views illustrating the production processes for manufacturing the semiconductor light emitting apparatus according to the fourth exemplary embodiment, with three light emitting devices installed therein;

DETAILED DESCRIPTION

Figure 1A:
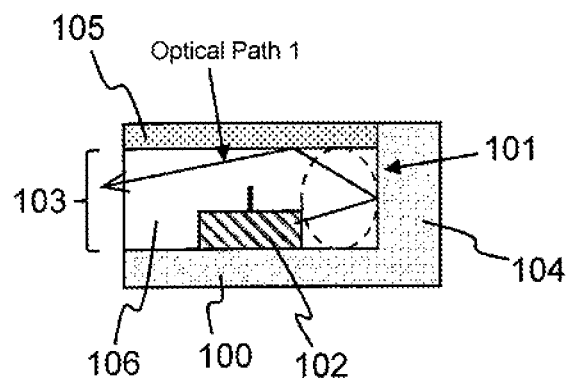
FIG. 1A is a cross-sectional view illustrating a conventional semiconductor light emitting apparatus.

A description will now be made below of semiconductor light emitting apparatuses of the presently disclosed subject matter with reference to the accompanying drawings in accordance with exemplary embodiments.

First Exemplary Embodiment

FIG. 4 is a cross-sectional view illustrating a semiconductor light emitting apparatus according to the present invention and FIG. 5E is a top plan view of the same. The semiconductor light emitting apparatus 20 of the present exemplary embodiment can include: a substrate 1 including electrodes formed on its surface (not shown in FIG. 4); a spacer 4, being a side member, mounted on the substrate 1 and having a semi-circular opening; a light emitting device (LED chip) 2 disposed on the substrate 1 within the opening; wires 8 connecting the light emitting device 2 to the electrodes; a light reflecting member 3 disposed in a space between the light emitting device 2 and the spacer 4; a ceiling member 5; and a sealing member 7 to be filled in a cavity defined by these members.

The sealing member 7 can seal the light emitting device 2 to surround it. The sealing member 7 can be, in addition to a transparent material, a transparent material containing functional particles such as phosphors, light scattering materials, particles for improving thixotropic property, and the like.

The ceiling member 5 may be light reflective and can be disposed at the upper area of the opening of the spacer 4 to cover the top surfaces of the light reflecting member 3 and the sealing member 7.

The semiconductor light emitting apparatus 20 is a light emitting diode of side emission type, in which a light projecting outlet 6 is defined at a side opposite to the spacer 4 where the spacer 4 is not provided. The light emitted from the light emitting device 2 can exit through the light projecting outlet 6. If phosphors are contained and dispersed in the sealing member 7, part of the emitted light can be wavelength-converted by the phosphors to exit through the light projecting outlet 6 together with the direct light from the light emitting device 2 to be mixed with the direct light. In this case, since the light reflecting member 3 is configured to be in contact with the rear surface of the light emitting device 2, the light emitted toward the rear surface of the light emitting device 2 cannot exit therethrough, but is returned to the inside of the light emitting device 2. The light emitted from the light emitting device 2 through the top surface and both side surfaces of the device 2 can be reflected by the ceiling member 5, the spacer 4 and the light reflecting member 3 to be directed to the light projecting outlet 6 and exit therethrough.

Accordingly, the present exemplary embodiment is configured as shown in FIG. 4 such that the semiconductor light emitting apparatus 20 of side emission type includes the light reflecting member 3 disposed in contact with the rear surface of the light emitting device 2 opposite from the light projecting outlet 6 with respect to the device 2. Thus, the light emitted toward the rear side can be reflected by the light reflecting member 3 toward the inside of the light emitting device 2, thereby shortening the optical path length from the light emitting device 2 through the sealing member 7 to the light projecting outlet 6 as a whole. This configuration can prevent the attenuation of light by the sealing member, thereby improving the light emission efficiency and the light utilization efficiency of the semiconductor light emitting apparatus 20.

Next, a description will be given of a method for manufacturing the semiconductor light emitting apparatus of FIG. 4 with reference to FIGS. 5A to 5E and 6A to 6E. It should be noted that FIGS. 5A to 5E show the respective top surfaces of the minimum unit (including two semiconductor light emitting apparatuses) and FIGS. 6A to 6E shows the respective cross-sectional views of three consecutive minimum units.

As shown in FIGS. 5A and 6A, a substrate 1 made of glass epoxy is prepared, for example. The substrate 1 can have electrode patterns 9a and 9b formed thereon by copper foil plated with Au or Ag in a predetermined shape in advance. A spacer 4 having a circular opening is fixed on the substrate 1 with an adhesive or the like. Next, a not-shown suction jig is allowed to hold a light emitting device 2 and place the same in position within the circular opening area. Performing die-bonding can connect the electrode of the light emitting device 2 with the electrodes on the substrate 1 with bonding wires 8.

Next, a light reflective resin material for forming the light reflecting member 3 is disposed in a space between the rear surface of the light emitting device 2 and the spacer 4. The material for the light reflecting member 3 can be a silicone resin including titanium oxide as a light reflecting material, and if required, particles for improving thixotropic property, dispersed in a predetermined amount. The prepared material can be filled in or coated to a predetermined space between the light emitting device 2 and the spacer 4 by a dispensing method, printing method, or the like. It should be noted that the uncured resin material can be preferably cured at the same time when the sealing member is cured at the next step. In view of this, the resin material remains uncured in this step, and the process proceeds to the next step.

Next, as shown in FIGS. 5C and 6C, a transparent resin material can be used to seal the space surrounding the light emitting device 2, being the space defined by the spacer 4, the light emitting device 2 and the light reflecting member 3, to form the sealing member 7. The material for forming the sealing member 7 can be, for example, a silicone resin containing predetermined phosphors, light scattering materials, particles for improving thixotropic property, and the like. The sealing member 7 can be filled by a dispensing method or a printing method.

In this case, the resin material for forming the light reflecting member 3 and the resin material for forming the sealing member 7 can be selected among resin materials that cannot be mixed with each other in an uncured state. Furthermore, it is preferred that the materials be highly thixotropic. By doing so, both materials can be raised to have predetermined shapes at respective predetermined positions without being mixed with each other.

Next, the resin materials for the light reflecting member 3 and the sealing member 7 are cured by an appropriate curing technique such as heating or UV light irradiation to form the light reflecting member 3 and the sealing member 7. As described above, if the resin materials having high thixotropic property and being curable by the same curing treatment are used, the curing process can be carried out a single step. Since the light reflecting member 3 and the sealing member 7 can be simultaneously formed, the manufacturing efficiency can be improved. In general, heat curing requires separate heating and cooling steps, which require substantial periods of time. As in the present exemplary embodiment, the light reflecting member 3 and the sealing member 7 can be cured simultaneously in a single curing treatment. Accordingly, the time required for curing can be shortened half the total time required for separate curing steps.

Next, as shown in FIGS. 5D and 6D, a light reflective resin material for forming a ceiling member 5 can be filled in or coated to an upper area of the opening of the spacer 4 so as to cover the upper area of the light reflecting member 3 and the sealing member 7. The resin material is cured, thereby forming the ceiling member 5. The ceiling member 5 may be provided as a separate light reflective plate member for covering the upper surfaces of the light reflecting member 3 and the sealing member 7. In the present exemplary embodiment, the ceiling member 5 can be formed by the light reflective resin material, so that the ceiling member 5 can have a shape following the shapes of the sealing member 7 and the light reflecting member 3, which can provide advantageous effects in manufacturing. The material for forming the ceiling member 5 can be, for example, a silicone resin containing light reflective titanium oxide particles dispersed in an appropriate amount. The prepared material can be filled in or coated to a predetermined space above the light reflective member 3 and the sealing member 7 by a dispensing method, printing method, or the like. Next, the resin material is cured by an appropriate curing technique such as heating or UV light irradiation to form the ceiling member 5.

Then, as shown in FIGS. 5E and 6E, the assembly of the substrate 1 and other components is cut at the center position of the opening of the spacer 4 vertically with respect to the surface of the substrate where the components are symmetrically arranged. Accordingly, the individual semiconductor light emitting apparatuses are separated. In such a way, the semiconductor light emitting apparatus of side-view type having the light reflecting member 3 can be manufactured.

As described above, the present exemplary embodiment can include the steps of filling or coating the respective resin materials by a dispensing method, printing method, and the like to form the light reflecting member 3, the sealing member 7 and the ceiling member 5, respectively, in-line. Therefore, there is no need to separately form these members by separate processes and then assemble these individual members. According to the present exemplary embodiment, a semiconductor light emitting apparatus having a light reflecting member that is easily and accurately provided in contact with the rear surface of a light emitting device can be manufactured with ease.

Furthermore, by adjusting the thixotropic properties or viscosity of the respective resin materials, the light reflecting member 3 and the sealing member 7 can be positioned in place without being mixed with each other even when they are uncured. This configuration can achieve simultaneous curing of these materials. Accordingly, the curing can be done by a single step, thereby improving the manufacturing efficiency. In this case, there is no need for the raw materials for the resin materials forming these members 3 and 7 to be the same. The materials should preferably have the predetermined thixotropic properties and/or viscosity, and, accordingly, they can be cured by the same process so that the manufacturing method includes a single curing process for these members.

On the other hand, the resin material for forming the ceiling member 5 may be a different material from the resin materials for forming the light reflecting member 3 and the sealing member 7. Alternatively, the ceiling member 5 can be formed as a metal film directly formed over the top surfaces of the light reflecting member 3 and the sealing member 7 by sputtering or the like.

In the present exemplary embodiment, as shown in FIG. 4, the light reflecting member 3 is configured to be in contact with the rear surface of the light emitting device 2. However, the present invention is not limited to this exemplary embodiment. A modification of the present exemplary embodiment will be described with reference to FIGS. 7A to 7D. In this modification, by adjusting the viscosity, thixotropic property and/or an injection amount of the resin material, the semiconductor light emitting apparatuses with various inner structures as illustrated in FIGS. 7A to 7D can be manufactured, thereby obtaining the advantageous effects of the present invention.

FIG. 7A shows a modification in which the light reflecting member 3 is configured to be in contact with only the rear surface of the light emitting device 2 as in FIG. 4. In this configuration, the light can be emitted only from the front end surface of the light emitting device 2 closer to the light projecting outlet 6. Furthermore, the ceiling member 5 can be formed to have a curved lower surface near the rear surface of the light emitting device 2, and accordingly, there is no cavity between the rear surface of the light emitting device 2 and the spacer 4 where the sealing member 7 may enter. In this configuration, the light emitted toward the rear surface side can be reflected by any of the light reflecting member 3 and the ceiling member 5, thereby effectively directing the light to the light projecting outlet.

FIG. 7B shows a modification in which the light reflecting member 3 is configured to cover the light emitting device 2 at its side surfaces other than the side surface closer to the light projecting outlet, namely the rear surface, top surface, right and left side surfaces of the light emitting device 2. In this configuration, the light can be emitted only from the front end surface of the light emitting device 2 closer to the light projecting outlet 6. FIG. 7C shows another modification in which the light reflecting member 3 and the sealing member 7 have the same top surface levels (are flush with each other) by adjusting the viscosity and/or thixotropic property of the respective resin materials of the light reflecting member 3 and the sealing member 7 (for example, the former has a higher viscosity and/or thixotropic property than the latter). In this case, the thickness of the ceiling member 5 covering the light reflecting member 3 and the sealing member 7 can be uniform. FIG. 7D shows still another modification in which the light reflecting member 3 is configured to have a height the same as that of the spacer 4. Accordingly, the ceiling member 5 is not provided on the light reflecting member 3, but is provided over the sealing member 7 near the light projecting outlet 6.

In any of the above modifications, the light emitted toward the rear surface of the light emitting device 2 cannot exit but can be reflected by the light reflecting member 3 that is provided in contact with the light emitting device 2 to be returned to the inside of the device 2. Accordingly, the optical path length in the sealing member 7 through which the light travels can be shortened, thereby preventing the light from attenuating by the sealing member 7. This configuration can improve the light utilization efficiency as well as the light emitting efficiency with which the light can effectively exit the light projecting outlet.

A separately prepared light emitting member 3 (having already been cured) may be disposed in the rear of the light emitting device.

Second Exemplary Embodiment

Figure 8A:
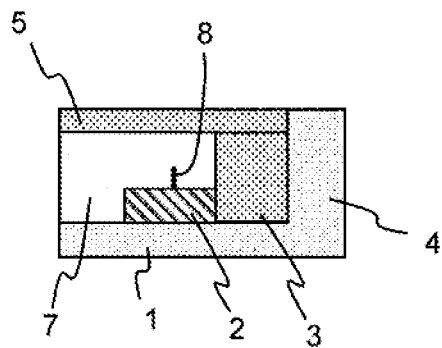
FIG. 8A is a cross-sectional view illustrating a semiconductor light emitting apparatus according to a second exemplary embodiment.
Figure 8B:
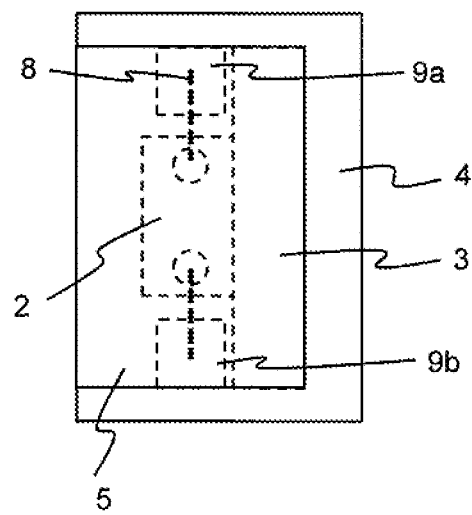
FIG. 8B is a top plan view of the same.

A second exemplary embodiment of the semiconductor light emitting apparatus of the present invention will be described with reference to FIGS. 8A and 8B.

In the second exemplary embodiment, a spacer 4 having a square opening is utilized instead of the spacer 4 having a semi-circular opening in the first exemplary embodiment. The light emitting device 2 and the light reflecting member 3 and the like are disposed within a rectangular parallelepiped cavity defined by this spacer 4.

In the present exemplary embodiment, the light reflecting member 3 is also configured so as to be in contact with the rear surface of the light emitting device 2. In this configuration, as in the first exemplary embodiment, the light cannot exit from the rear surface of the light emitting device 2, thereby improving the light utilization efficiency. At the same time, the optical path length can be shortened within the cavity, thereby improving the light emitting efficiency with which the light can effectively exit the light projecting outlet 6.

The semiconductor light emitting apparatus of the present exemplary embodiment can be manufactured by the same method as in the first exemplary embodiment except for utilizing the spacer 4 having a square opening instead of the spacer 4 having a semi-circular opening. Accordingly, a detailed description thereof will be omitted here.

Third Exemplary Embodiment

A third exemplary embodiment of the semiconductor light emitting apparatus of the present invention will be described with reference to FIGS. 9A to 9E.

In the third exemplary embodiment, instead of utilizing the spacer 4 in the first exemplary embodiment, certain thixotropic properties of the resin materials of the light emitting member and the sealing member are utilized to manufacture the semiconductor light emitting apparatus having the same advantageous effect as in the first exemplary embodiment.

Figure 9A:
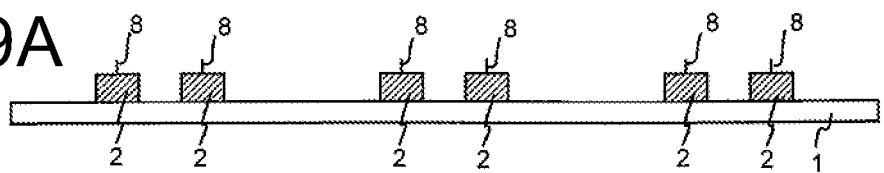
FIGS. 9A, 9B, 9C, 9D, and 9E are cross-sectional views illustrating the production processes for manufacturing the semiconductor light emitting apparatus according to a third exemplary embodiment.

As shown in FIG. 9A, a substrate 1 having an electrode pattern formed thereon is prepared as in the same process of FIGS. 5A and 6A of the first exemplary embodiment. The different point from the first exemplary embodiment is the absence of the spacer 4. In this state, the light emitting device 2 is mounted on the substrate 1 at a predetermined position, and bonding wires 8 connect the electrode pattern with the device 2.

Figure 9B:
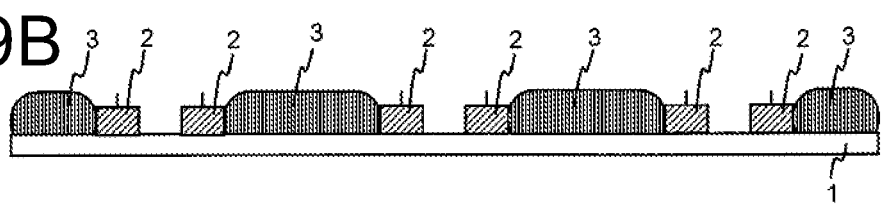

Next, as shown in FIG. 9B, a resin material for forming the light reflecting member 3 is prepared as the same material used in the first exemplary embodiment in the process shown in FIGS. 5B and 6B, and is filled in or coated to a predetermined space on the substrate 1 by a dispensing method, printing method, or the like. In this instance, the thixotropic property and/or the viscosity of the resin material is adjusted to fill/coat the material so that the material is raised to or above the uppermost level of the light emitting device 2. This process can form an upper surface the light reflecting member 3 is convex and is in contact with the light emitting device 2.

In the present exemplary embodiment, since there is no spacer 4, the light reflecting member 3 can be formed by filling/coating the resin material not only at the originally intended area as in the first exemplary embodiment, but also at the area where the spacer 4 is arranged in the first exemplary embodiment. In this instance, the resin material for forming the light reflecting member 3 can be shaped to have an appropriate shape so that a cavity having a predetermined circular or square shape is defined.

Figure 9C:
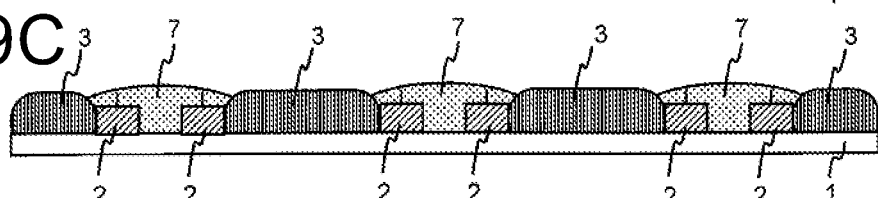
Figure 9D:
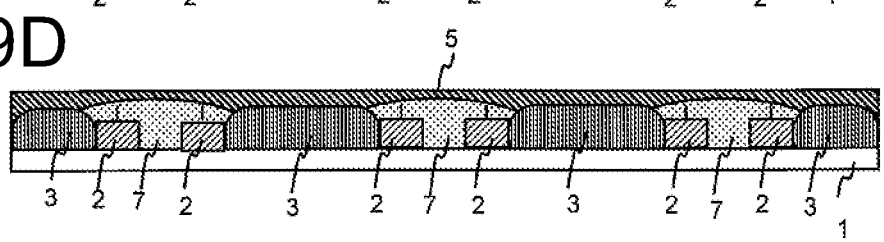

In the processes as shown in FIGS. 9C and 9D, the same as in the processes of FIGS. 5C and 5D, and 6C and 6D, the resin material for the sealing member 7 is filled in or coated to an appropriate area, and then cured together with the resin material for forming the light reflecting member 3. Thereafter, the resin material for forming the ceiling member 5 is filled in or coated to an upper area of the light reflecting member 3 and the sealing member 7, and cured to form the ceiling member 5.

Figure 9E:
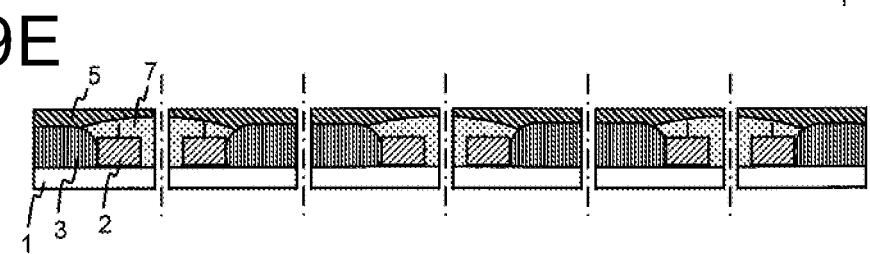

Finally, in the process as shown in FIG. 9E, the assembly of these components is cut at the center position of the cavity defined by the light reflecting member 3 vertically with respect to the surface of the substrate 1 where the components are symmetrically arranged. Accordingly, the individual semiconductor light emitting apparatuses are separated.

In this case, the third exemplary embodiment does not use a spacer 4, thereby reducing the number of the components. In the third exemplary embodiment, since the light reflecting member 3 is adjusted in its viscosity and/or thixotropic property and the amount used for filling/coating, a desired cavity shape can be formed. Accordingly, in addition to the advantageous effects of the previous first and second exemplary embodiments, the third exemplary embodiment can control the improved light emitting efficiency by the desired cavity shape.

Fourth Exemplary Embodiment

Next, a fourth exemplary embodiment of the semiconductor light emitting apparatus of the present invention will be described with reference to FIGS. 10A to 10E and 11A to 11E.

In the fourth exemplary embodiment, a plurality of light emitting devices are arranged within the semicircular cavity so that the light emitted from the plurality of light emitting devices is mixed together to be emitted through the light projecting outlet.

First, a method for manufacturing a semiconductor light emitting apparatus having two light emitting devices 2a and 2b installed therein will be described with reference to the top plan views of FIGS. 10A to 10E. It should be noted that the same processes in the manufacturing processes of the present exemplary embodiment as in the first exemplary embodiment will be omitted in some cases.

First, as shown in FIG. 10A, a substrate 1 having predetermined electrode patterns 9a and 9b formed thereon is prepared. A spacer 4 having a circular opening is mounted thereon and fixed by an adhesive or the like. Within the opening, two pairs of light emitting devices 2a and 2b are mounted at predetermined positions. Then, electrodes formed on the light emitting devices 2a and 2b are connected to the electrode patterns 9a and 9b by bonding wires 8, respectively.

During the bonding process, there is no light reflecting member 3 disposed within the circular opening area of the spacer 4. In this instance, the light emitting devices 2a and 2b are disposed near the center area of the circular opening, namely near the position where the light projecting outlet will be formed, and then the wires 8 can be bonded toward the electrode pattern 9a in the rear of the light emitting devices 2a and 2b.

Next, as shown in FIG. 10B, the resin material for forming the light reflecting member 3 is filled in or coated to a predetermined space between the spacer 4 and the rear surfaces of the light emitting devices 2a and 2b by a dispensing method, printing method, or the like. In this instance, the spaces in the rear of the light emitting devices 2a and 2b contain the curved wires 8. Accordingly, the uncured resin material is filled in the spaces so as to bury the curved wires 8 with the uncured resin material therearound. In this manner, the shapes and electric characteristics of the wires 8 are not adversely affected.

Then, as shown in FIGS. 10C and 10D, the resin material for forming the sealing member 7 is filled in or coated to an appropriate area, and then cured together with the resin material for forming the light reflecting member 3. Thereafter, the resin material for forming the ceiling member 5 is filled in or coated to an upper area of the light reflecting member 3 and the sealing member 7, and cured to form the ceiling member 5.

Finally, in the process as shown in FIG. 10E, the assembly of these components is cut at the center position of the cavity defined by the spacer 4 vertically with respect to the surface of the substrate where the components are symmetrically arranged. Accordingly, the individual semiconductor light emitting apparatuses are separated.

As described above, the uncured resin material is filled in the space in the rear of the light emitting device and then cured. Accordingly, the wires can be arranged in the rear of the light emitting devices in advance. This can achieve a high degree of freedom for arranging the wires and the electrode patterns. Furthermore, even if the cavity is narrow, the light emitting devices can be arranged side by side near the position where the light projecting outlet will be formed after separation. Accordingly, even when the apparatus is designed to be compact, the two light emitting devices can emit light near the light projecting outlet while mixing their light, thereby providing a semiconductor light emitting apparatus with high light intensity.

As in the previous exemplary embodiments, the light reflecting member is arranged to be in contact with the rear surface of the light emitting device. Accordingly, the optical path length through the sealing member 7 with respect to any of the light emitting devices can be shortened, thereby effectively preventing the light from attenuating due to the sealing member. This can increase the light intensity as a whole.

As a modification of the present exemplary embodiment, a method for manufacturing a semiconductor light emitting apparatus having three light emitting devices 2a, 2b, and 2c installed therein will be described with reference to the top plan views of FIGS. 11A to 11E.

First, as shown in FIG. 11A, a substrate 1 having predetermined electrode patterns 9a, 9b, 9c, and 9d formed thereon is prepared. A spacer 4 having a circular opening is mounted thereon and fixed by an adhesive or the like. Within the opening, two sets of light emitting devices 2a, 2b, and 2c are mounted at predetermined positions. Then, electrodes formed on the light emitting devices 2a, 2b, and 2c are connected to the electrode patterns 9a, 9b, 9c, and 9d by bonding wires 8, respectively. The illustrated exemplary embodiment utilizes the light emitting device 2b having a backside electrode, and the backside electrode is connected to the electrode pattern where the device 2c is mounted via a solder bump or the like during die bonding. The top electrode of the light emitting device 2b is connected to the electrode pattern 9b by the wire 8.

During the bonding process, there is no light reflecting member 3 disposed within the circular opening area of the spacer 4. Accordingly, the wires 8 can be freely arranged within this area. Namely, the wires 8 can be bonded toward the electrode patterns 9a and 9b in the rear of the light emitting devices 2a and 2b. In this configuration, the light emitting devices 2a, 2b, and 2c are disposed near the center area of the circular opening, namely near the position where the light projecting outlet will be formed.

Next, as shown in FIG. 11B, the resin material for forming the light reflecting member 3 is filled in or coated to predetermined spaces between the spacer 4 and the rear surfaces of the light emitting devices 2a, 2b, and 2c by a dispensing method, printing method, or the like. In this instance, the spaces in the rear of the light emitting devices 2a, 2b, and 2c contain the curved wires 8. Accordingly, the uncured resin material is filled so as to bury the curved wires 8 with the uncured resin material therearound. In this manner, the shapes and electric characteristics of the wires 8 are not adversely affected.

Then, as shown in FIGS. 11C and 11D, the resin material for forming the sealing member 7 is filled in or coated to an appropriate area, and then cured together with the resin material for forming the light reflecting member 3. Then, as in the previous exemplary embodiment, the ceiling member 5 is formed. Finally, in the process as shown in FIG. 11E, the assembly of these components is cut at the center position of the cavity defined by the spacer 4 vertically with respect to the surface of the substrate 1 where the components are symmetrically arranged. Accordingly, the individual semiconductor light emitting apparatuses are separated.

As described above, the modification of the present exemplary embodiment can manufacture the semiconductor light emitting apparatus including three light emitting devices arranged near the position of the light projecting outlet.

Namely, in the present exemplary embodiment, a plurality of light emitting devices each having different emission wavelengths can be disposed side by side near the position where the light projecting outlet will be formed. The side-by-side arrangement can prevent the absorption of light by adjacent light emitting devices, thereby preventing light attenuation. Accordingly, even when the apparatus is designed to be compact, three light emitting devices can emit desired light while mixing their light to, for example, white light, thereby providing a semiconductor light emitting apparatus enabling to emit white light.

Fifth Exemplary Embodiment

Next, a fifth exemplary embodiment of the semiconductor light emitting apparatus of the present invention will be described with reference to FIGS. 12A and 12B.

In the fifth exemplary embodiment, a spacer 4 having a square opening as in the second exemplary embodiment is utilized instead of the spacer 4 having a semi-circular opening in the first exemplary embodiment. In addition, a plurality of light emitting devices, a light reflecting member, and the like are arranged within the square-shaped cavity defined by the spacer 4. It should be noted that FIGS. 12A and 12B illustrate the semiconductor light emitting apparatus where the ceiling member 5 and the sealing member 7 are omitted in the drawing for facilitating understanding.

The method for manufacturing the semiconductor light emitting apparatus of the present exemplary embodiment is the same as the fourth exemplary embodiment except for the spacer 4 having a square opening. Accordingly, the description for the other features will be omitted here.

Figure 12A:
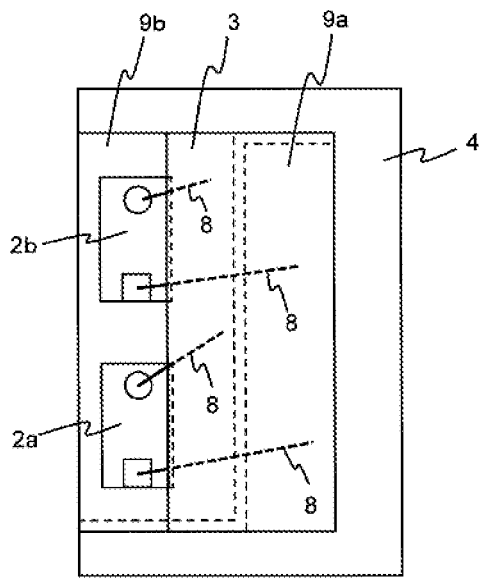
FIG. 12A is a top plan view illustrating a semiconductor light emitting apparatus according to a fifth exemplary embodiment, with two light emitting devices installed therein.
Figure 12B:
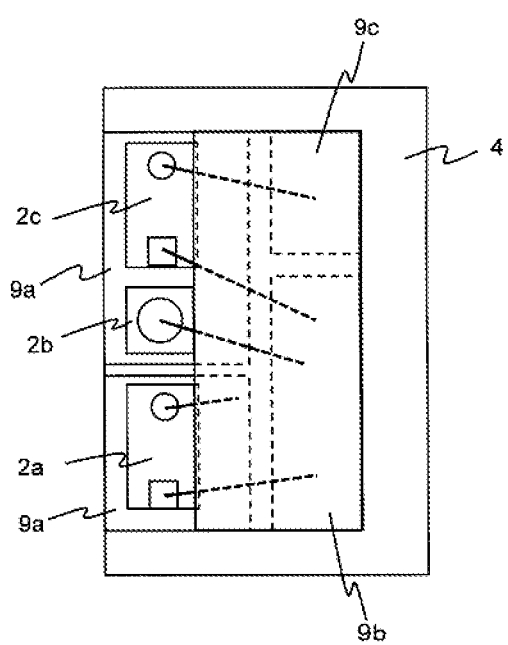
FIG. 12B is a top plan view illustrating a semiconductor light emitting apparatus according to the fifth exemplary embodiment, with three light emitting devices installed therein.

The present exemplary embodiment of FIG. 12A includes two light emitting devices 2a and 2b while FIG. 12B shows its modification where three light emitting devices 2a, 2b, and 2c are arranged. When compared with the case where the spacer 4 having a circular opening is used as in the fourth exemplary embodiment, the cavity opening of the semiconductor light emitting apparatuses of FIGS. 12A and 12B is wider. This configuration can simplify the shape and arrangement of the electrode pattern. In other words, the wiring accuracy of bonding wires 8 can be alleviated, thereby improving the process yield of the production.

Sixth Exemplary Embodiment

A sixth exemplary embodiment of the semiconductor light emitting apparatus of the present invention will be described with reference to FIGS. 13A and 13B.

Figure 13A:
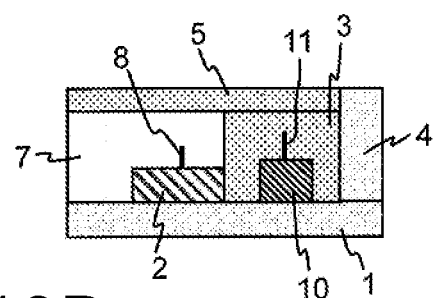
FIG. 13A is a cross-sectional view illustrating a semiconductor light emitting apparatus according to a sixth exemplary embodiment.
Figure 13B:
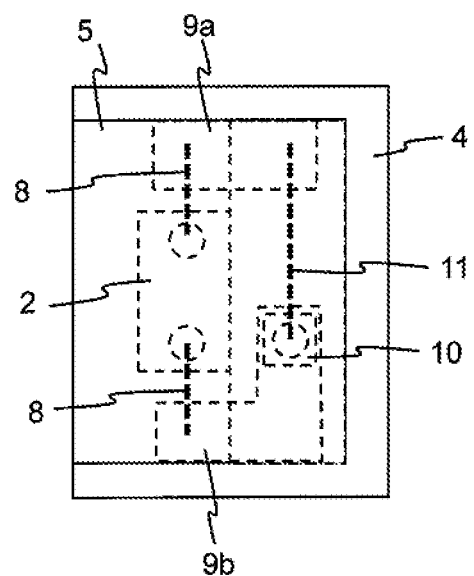
FIG. 13B is a top plan view of the same.

The semiconductor light emitting apparatus according to the present exemplary embodiment as illustrated in FIGS. 13A and 13B is configured to have another electronic circuit device such as a protection diode 10 arranged in the space where the light reflecting member 3 is to be arranged between the rear surface of the light emitting device 2 and the spacer 4. The protection diode 10 can be connected to an electrode pattern 9a via a wire 11.

The semiconductor light emitting apparatus of the present exemplary embodiment and the method for manufacturing the same are the same as the second exemplary embodiment. Accordingly, the description for the other features will be omitted here. The protection diode 10 and the wire 11 can be arranged at the same process at which the light emitting device 2 and the wire 8 are arranged, and then a wire bonding operation is performed.

After the wire bonding operation, the resin material for forming the light reflecting member 3 is filled in or coated to a predetermined space between the spacer 4 and the rear surface of the light emitting device 2. In this instance, the space in the rear of the light emitting device 2 contains the protection diode 10, so that the light reflecting member 3 can bury the protection diode 10. This configuration can facilitate the effective space utilization within the cavity, thereby achieving the production of compact semiconductor light emitting apparatuses.

Seventh Exemplary Embodiment

In the previous first, second, and fourth to sixth exemplary embodiments, the light reflecting member 3 is arranged to be in contact with the light emitting device 2 and the spacer 4. In the seventh exemplary embodiment, as shown in FIG. 14, there is a space 12 between the light reflecting member 3 and the spacer 4.

Figure 14:
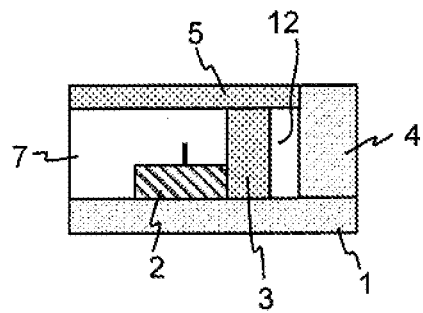
FIG. 14 is a cross-sectional view illustrating a semiconductor light emitting apparatus according to a seventh exemplary embodiment.

Even when there is the space 12 as shown in FIG. 14, the light reflecting member 3 is in contact with the rear surface of the light emitting device 2, and accordingly, the light reflecting member 3 can reflect the direct light at the rear surface to the inside of the light emitting device 2.

Figure 1B:
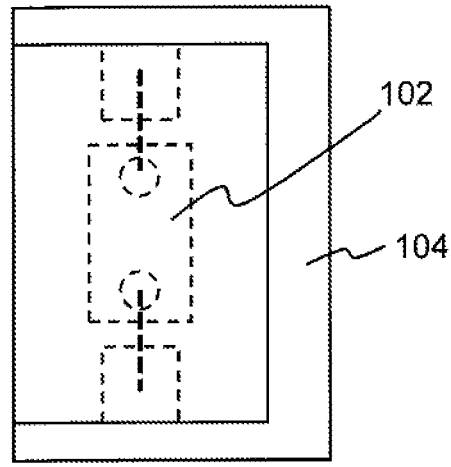
FIG. 1B is a top plan view of the same.
Figure 3A:
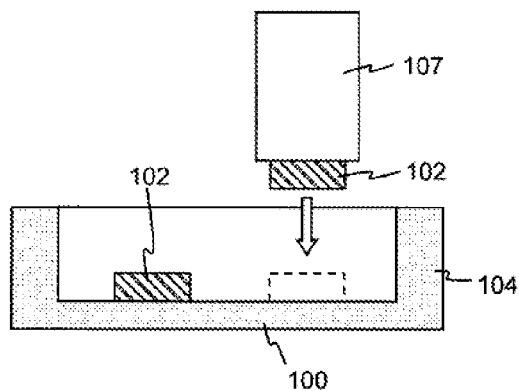
FIGS. 3A, 3B, and 3C are diagrams illustrating the statuses in which a suction jig moves the light emitting device in the conventional semiconductor light emitting apparatus.
Figure 3B:
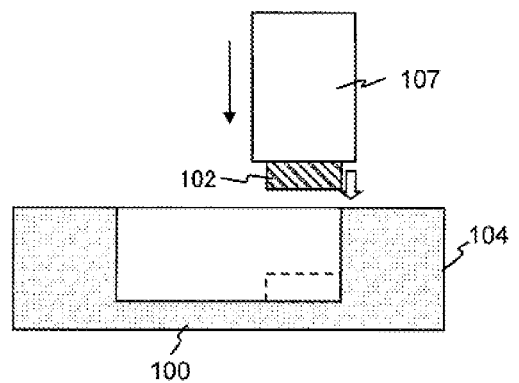
Figure 3C:
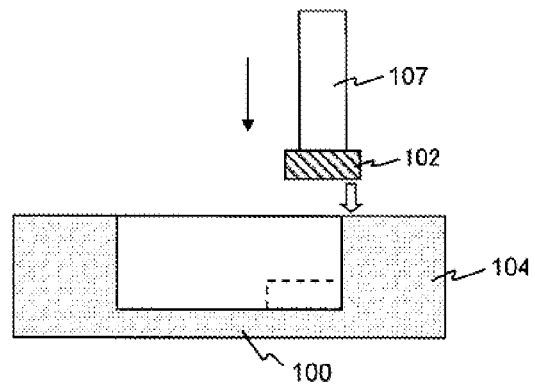

The light reflecting member 3 forming the space 12 in FIG. 14 can be formed by filling or coating the resin material having been adjusted in thixotropic property and/or viscosity by a dispensing method, a printing method, or the like. In FIG. 14, the light reflecting member 3 is illustrated to have a square cross section, but the present invention is not limited thereto. As in FIG. 1, the cross section of the light reflecting member 3 may include a raised surface.

[Liquid Crystal Display Apparatus]

Figure 15:
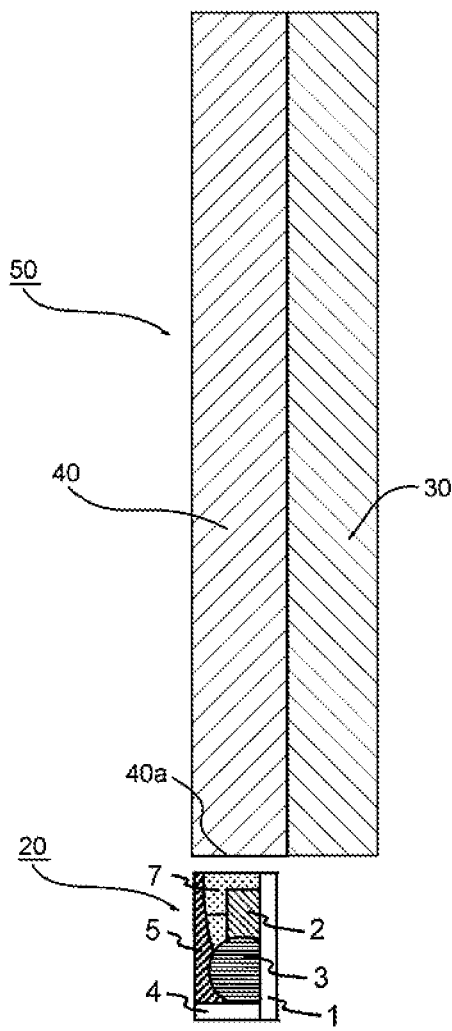
FIG. 15 is a cross-sectional view illustrating part of a liquid crystal display device according to the present invention, wherein any one of the first to seventh exemplary embodiments of the semiconductor light emitting apparatus is used.

A light source apparatus for an edge-lighting type backlight can be configured by utilizing the semiconductor light emitting apparatus according to any of the foregoing first to seventh exemplary embodiments as described above. FIG. 15 illustrates a liquid crystal display apparatus 50 according to the present invention. The liquid crystal display apparatus 50 can include a liquid crystal panel 30, a light guide plate 40 disposed in the rear of the liquid crystal panel 30, and a semiconductor light emitting apparatus 20 according to the present invention disposed near the end face 40a of the light guide plate 40. In this configuration, the semiconductor light emitting apparatus 20 can be disposed so that the light projecting outlet 6 faces the end face 40a of the light guide plate 40. It should be noted that FIG. 15 does not illustrate required wirings, controlling devices, and the like but only the optical system for facilitating the understanding of the present invention.

As described above, the semiconductor light emitting apparatuses 20 of the exemplary embodiments have the shortened optical path length passing through the sealing member 7, thereby enabling them to emit light with high intensity. The high intensity light can enter the end face 40a of the light guide plate 40, and propagate therethrough to illuminate the liquid crystal display panel 30, thereby providing a bright liquid crystal display apparatus 50.

In the above-described exemplary embodiment, it is described that the spacer or side member is configured to surround the light emitting device so as to have a single light projecting outlet. However, the present invention is not limited thereto. For example, instead of the spacer 4 having a semi-circular or square opening, two planar side members can be disposed both sides of the light emitting device spaced apart therefrom, and a resin material for forming a light reflecting member is filled in or coated to spaces between the light emitting device and the respective side members. Then, a resin material for a sealing member is filled in or coated to the remaining areas, and a resin material for a ceiling member is covered to the top of these members. Thereby, the semiconductor light emitting apparatus can emit light from both sides of the light emitting devices where the side members are not provided. In this configuration, the optical path length passing through the sealing member can be from the front and rear surfaces of the light emitting device to the respective light projecting outlet, thereby preventing the light from attenuating due to the sealing member.

In the above-described exemplary embodiments, one, two, or three light emitting devices 2 are arranged with respect to a single light projecting outlet 6. However, the present invention is not limited to these features. The semiconductor light emitting apparatus can include an elongated slit-shaped opening in one direction, along which four or more light emitting devices are aligned in line to face the opening.

EXAMPLE

A description will be given of an exemplary semiconductor light emitting apparatus of the present invention.

As the example, the semiconductor light emitting apparatus of FIG. 4 in accordance with the first exemplary embodiment was manufactured. First, electrode patterns 9a and 9b made of copper foil were formed on a glass epoxy substrate 1. A spacer 4 having a circular opening with a diameter of 1.7 mm and made of glass epoxy was fixed on the substrate 1 by an adhesive as shown in FIG. 6A. In this spacer 4, an Al film had been formed on an inner wall of the opening. Light emitting devices 2 were disposed at predetermined positions within the opening area and die-bonded. It should be noted that the distance between the rear surface of the light emitting device 2 and the spacer 4 was set to 0.4 mm.

The top electrodes of the light emitting devices 2 were connected to the electrodes on the electrode pattern of the substrate 1 by bonding wires 8.

A resin material for forming the light reflecting member 3 was prepared by dispersing titanium oxide particles having a particle diameter of 200 to 300 µm in an amount of 50 wt % in a silicone resin. The resin material was filled in a space defined by the light emitting device 2 and the spacer 4 by a dispensing method. In this manner, an uncured light reflecting member 3 was formed as shown in FIG. 6B.

Next, a resin material for forming the sealing member 7 was prepared by dispersing YAG phosphor in an amount of 10 to 20 wt % in a silicone resin. Then, as shown in FIG. 6C, the resin material was filled in a space around the light emitting device 2.

Thereafter, the assembly was heated in a furnace to cure the resin materials for the light reflecting member 3 and the sealing member 7.

Then, a resin material for forming the ceiling member 5 was prepared by dispersing titanium oxide particles in an amount of 30 to 60 wt % in a silicone resin. The resin material was coated over the top surfaces of the light reflecting member 3 and the sealing member 7, and heat treated to cure the resin, thereby forming the ceiling member 5 as shown in FIG. 6D. Finally, as shown in FIG. 6E, the assembly of these components was cut at the center position of the cavity defined by the spacer 4 vertically with respect to the surface of the substrate 1 where the components are symmetrically arranged. Accordingly, the individual semiconductor light emitting apparatuses were separated. In this way, the semiconductor light emitting apparatus of side-view type having the light reflecting member 3 was manufactured.

As a comparative example, a semiconductor light emitting apparatus was manufactured in the same manner as the previous example, except that the light reflecting member 3 was not provided and the sealing member 7 surrounded around the light emitting device 2 entirely.

The obtained semiconductor light emitting apparatuses of the example and comparative example were determined in light intensity measured at the light projecting opening. The measurement revealed that the light intensity of the example was increased by approx. 20% higher than that of the comparative example.

It will be apparent to those skilled in the art that various modifications and variations can be made in the presently disclosed subject matter without departing from the spirit or scope of the presently disclosed subject matter. Thus, it is intended that the presently disclosed subject matter cover the modifications and variations of the presently disclosed subject matter provided they come within the scope of the appended claims and their equivalents. All related art references described above are hereby incorporated in their entirety by reference.

What is claimed is:

1. A method for manufacturing a semiconductor light emitting apparatus, comprising:
    disposing a first light emitting device and a second light emitting device on a substrate having a predetermined electrode pattern formed thereon;
    disposing a side member on the substrate to be spaced apart from the light emitting devices with a predetermined space;
    electrically connecting the light emitting devices to the electrode pattern;

disposing a first light reflecting member in a first space between at least one side surface of the first light emitting device and the side member so that the light reflecting member is in contact with the at least one side surface of the first light emitting device, and disposing a second light reflecting member in a second space between at least one side surface of the second light emitting device and the side member so that the light reflecting member is in contact with the at least one side surface of the second light emitting device;

disposing a sealing member to surround the light emitting devices other than the at least one side surface of each of the light emitting devices that is in contact with one of the light reflecting members, the sealing member being adapted to transmit light from the light emitting devices and having a shape that rises to have a maximum height portion located at a position opposite to the first light reflecting member with respect to the first light emitting devices and opposite to the second light reflecting member with respect to the second light emitting device;

disposing a ceiling member at least on the sealing member to allow the ceiling member to follow an outer shape of the sealing member, the ceiling member being light reflective, to thereby form an assembly; and cutting the assembly at a position opposite to the light reflecting members with the light emitting devices interposed therebetween to separate the assembly into individual semiconductor light emitting apparatuses.

2. The method for manufacturing a semiconductor light emitting apparatus according to claim 1,
wherein each of the individual semiconductor light emitting apparatuses includes a light projecting outlet, and wherein in each of the individual semiconductor light emitting apparatuses a side surface of the light emitting device closest to the light projecting outlet functions as a front surface, a side surface of the light emitting device opposite from the front surface functions as a rear surface, and the side member surrounds side surfaces and the rear surface of the light emitting device other than the front surface while being spaced apart therefrom;
wherein disposing the first light reflecting member includes disposing the first light reflecting member in a space between the side member on a rear surface side of the first light emitting device and the rear surface of the first light emitting device, and bringing the first light reflecting member into contact with the rear surface of the first light emitting device; and
wherein disposing the second light reflecting member includes disposing the second light reflecting member in a space between the side member on a rear surface side of the second emitting device and the rear surface of the second light emitting device, and bringing the second light reflecting member into contact with the rear surface of the second light emitting device.

3. The method for manufacturing a semiconductor light emitting apparatus according to claim 2,
wherein disposing the light reflecting members includes disposing an uncured resin material for forming the light reflecting members;
wherein disposing the sealing member includes disposing an uncured resin material for forming the sealing member; and
wherein the resin materials for forming the light reflecting members and for forming the sealing member are cured simultaneously.

4. The method for manufacturing a semiconductor light emitting apparatus according to claim 3, wherein disposing the light reflecting members includes forming the light reflecting members by using a resin material having at least one of an adjusted thixotropic property and an adjusted viscosity so that the light reflecting members have a raised shape having a convex surface that is higher than top surfaces of the light emitting devices.

5. The method for manufacturing a semiconductor light emitting apparatus according to claim 2,
wherein the electrode pattern on the substrate is present between the light emitting devices and the side member, and electrically connecting the light emitting devices to the pattern includes connecting the light emitting devices to the electrode pattern between the light emitting devices and the side member via wires; and
wherein the wires are buried in the light reflecting members with an original shape of the wires remaining.

6. The method for manufacturing a semiconductor light emitting apparatus according to claim 5, wherein disposing the light reflecting members includes forming the light reflecting members by using a resin material having at least one of an adjusted thixotropic property and an adjusted viscosity so that the light reflecting members have a raised shape having a convex surface that is higher than top surfaces of the light emitting devices.

7. The method for manufacturing a semiconductor light emitting apparatus according to claim 2, wherein disposing the light reflecting members includes forming the light reflecting members by using a resin material having at least one of an adjusted thixotropic property and an adjusted viscosity so that the light reflecting members have a raised shape having a convex surface that is higher than top surfaces of the light emitting devices.

8. The method for manufacturing a semiconductor light emitting apparatus according to claim 1,
wherein disposing the light reflecting members includes disposing an uncured resin material for forming the light reflecting members;
wherein disposing the sealing member includes disposing an uncured resin material for forming the sealing member; and
wherein the resin materials for forming the light reflecting members and for forming the sealing member are cured simultaneously.

9. The method for manufacturing a semiconductor light emitting apparatus according to claim 8,
wherein the electrode pattern on the substrate is present between the light emitting devices and the side member, and electrically connecting the light emitting devices to the pattern includes connecting the light emitting devices to the electrode pattern between the light emitting devices and the side member via wires; and
wherein the wires are buried in the light reflecting members with an original shape of the wires remaining.

10. The method for manufacturing a semiconductor light emitting apparatus according to claim 9, wherein disposing the light reflecting members includes forming the light reflecting members by using a resin material having at least one of an adjusted thixotropic property and an adjusted viscosity so that the light reflecting members have a raised shape having a convex surface that is higher than top surfaces of the light emitting devices.

11. The method for manufacturing a semiconductor light emitting apparatus according to claim 8, wherein disposing the light reflecting members includes forming the light reflecting members by using a resin material having at least one of an adjusted thixotropic property and an adjusted viscosity so that the light reflecting members have a raised shape having a convex surface that is higher than top surfaces of the light emitting devices.

12. A semiconductor light emitting apparatus comprising:
   a substrate;
   a light emitting device disposed on the substrate;
   a side member surrounding the light emitting device and spaced apart therefrom with a predetermined space, the side member having an opening at one side;
   a light reflecting member disposed in a space between a side surface of the light emitting device opposite from the opening and the side member so that the light reflecting member is in contact with the side surface of the light emitting device opposite from the opening;
   a sealing member disposed in a space between the side member and side surfaces of the light emitting device where the light reflecting member is not provided, the sealing member being adapted to transmit light from the light emitting device, and the sealing member having a shape that rises such that a portion thereof that is over a side surface of the light emitting device facing the opening is higher than a portion thereof that is over the side surface of the light emitting device opposite from the opening; and
   a ceiling member covering at least the sealing member, the ceiling member being light reflective.

13. The semiconductor light emitting apparatus according to claim 12, wherein:
   the substrate has an electrode formed thereon;
   a wire for electrically connecting the electrode on the substrate and the light emitting device is disposed in the space between the side surface of the light emitting device opposite from the opening and the side member; and
   the light reflecting member is provided so as to bury the wire.

14. The semiconductor light emitting apparatus according to claim 13, further comprising an electronic circuit device disposed in the space between the side surface of the light emitting device opposite from the opening and the side member, wherein the light reflecting member is provided so as to bury the electronic circuit device.

15. The semiconductor light emitting apparatus according to claim 12, further comprising an electronic circuit device disposed in the space between the side surface of the light emitting device opposite from the opening and the side member, wherein the light reflecting member is provided so as to bury the electronic circuit device.

16. A liquid crystal display apparatus comprising:
   a liquid crystal panel having a front surface that is observed from outside and a rear surface opposite from the front surface;
   a light guide plate disposed to face the rear surface of the liquid crystal panel and having an end surface that serves as a light receiving surface; and
   a semiconductor light emitting apparatus disposed so as to face the end surface of the light guide plate, the semiconductor light emitting apparatus including:
      a substrate;
      a light emitting device disposed on the substrate;
      a side member surrounding the light emitting device and spaced apart therefrom with a predetermined space, the side member having an opening at one side;
      a light reflecting member disposed in a space between a side surface of the light emitting device opposite from the opening and the side member so that the light reflecting member is in contact with the side surface of the light emitting device opposite from the opening;
      a sealing member disposed in a space between the side member and side surfaces of the light emitting device where the light reflecting member is not provided, the sealing member being adapted to transmit light from the light emitting device, and the sealing member having a shape that rises such that a portion thereof that is over a side surface of the light emitting device facing the opening is higher than a portion thereof that is over the side surface of the light emitting device opposite from the opening; and
      a ceiling member covering at least the sealing member, the ceiling member being light reflective.

* * * * *